United States Patent
Chou

(10) Patent No.: US 9,655,277 B2
(45) Date of Patent: May 16, 2017

(54) DISPLAY DEVICE HAVING FAN

(71) Applicant: Young Lighting Technology Inc., Hsin-Chu (TW)

(72) Inventor: Bor-Bin Chou, Hsin-Chu (TW)

(73) Assignee: Young Lighting Technology Inc., Hsin-Chu (TW)

( * ) Notice: Subject to any disclaimer, the term of this patent is extended or adjusted under 35 U.S.C. 154(b) by 0 days.

(21) Appl. No.: 14/960,426

(22) Filed: Dec. 6, 2015

(65) Prior Publication Data
US 2016/0205805 A1 Jul. 14, 2016

(30) Foreign Application Priority Data

Jan. 9, 2015 (TW) .............................. 104100763 A

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/20954* (2013.01)

(58) Field of Classification Search
CPC . G06F 1/16; G06F 1/1601; G06F 1/20; G06F 1/203; G06F 1/206; G06F 1/1637; G06F 1/1633
USPC .......... 361/679.21–679.3, 694–697; 165/9.3, 165/104.34; 455/575.1–575.9; 349/56, 349/58, 59, 60
See application file for complete search history.

(56) References Cited

U.S. PATENT DOCUMENTS

| 7,640,662 | B2 | 1/2010 | Haglid | |
|---|---|---|---|---|
| 9,470,924 | B2 * | 10/2016 | Dunn | ................ G02F 1/133382 |
| 2011/0013114 | A1 * | 1/2011 | Dunn | ................ G02F 1/133385 |
| | | | | 349/61 |

(Continued)

FOREIGN PATENT DOCUMENTS

| CN | 102135677 | 7/2011 |
|---|---|---|
| CN | 104200758 | 12/2014 |
| TW | I292694 | 1/2008 |

(Continued)

OTHER PUBLICATIONS

"Office Action of Taiwan Counterpart Application", issued on Apr. 7, 2016, p. 1-p. 7.

*Primary Examiner* — Anthony Haughton
(74) *Attorney, Agent, or Firm* — Jianq Chyun IP Office

(57) ABSTRACT

A display device includes a casing, a display panel, a transparent plate, a fixing pillar, at least one flow-guiding component, and a fan. The casing has front, back and side surfaces. The back surface has a first airflow passage. The display panel is disposed in the casing. The transparent plate is disposed on the front surface. A second airflow passage is foamed between the display panel and the transparent plate. The fixing pillar is disposed between the first and second airflow passages for fixing the display panel. The flow-guiding component is disposed in the second airflow passage and adjacent to the side surface. The fan is disposed on the back surface and provides a heat-dissipation airflow. The heat-dissipation airflow flows through the first airflow passage and the fixing pillar and arrives at the flow-guiding component, and flows in the second airflow passage after being guided by the flow-guiding component.

11 Claims, 3 Drawing Sheets

(56) References Cited

U.S. PATENT DOCUMENTS

2012/0106081 A1* 5/2012 Hubbard .......... G02F 1/133308
                                                      361/696

FOREIGN PATENT DOCUMENTS

| TW | M365483 | 9/2009 |
|----|---------|--------|
| TW | M383909 | 7/2010 |
| TW | 201440623 | 10/2014 |

* cited by examiner

DISPLAY DEVICE HAVING FAN

CROSS-REFERENCE TO RELATED APPLICATION

This application claims the priority benefit of Taiwan application serial no. 104100763, filed on Jan. 9, 2015. The entirety of the above-mentioned patent application is hereby incorporated by reference herein and made a part of this specification.

BACKGROUND OF THE INVENTION

Field of the Invention

The invention relates to a display device, and more particularly, to a display device having a fan.

Description of Related Art

As the electronic industry prospers, flat panel display devices have gradually replaced cathode ray tube display devices to become the current mainstream product. Among the flat panel display devices, liquid crystal displays (LCD) are more technologically matured and more popular. LCDs are used not only in portable electronic devices such as notebook computers, tablet PCs or smartphones, but also in outdoor equipment such as automated teller machines (ATM).

In terms of the LCD used in outdoor equipment such as ATM, in order to prevent an excessive temperature rise in a liquid crystal display panel of the LCD due to outdoor sunlight irradiation, a heat-dissipation fan is required for providing a heat-dissipation airflow to a display face of the liquid crystal display panel. However, if an assembling structure (such as a fixing pillar for fixing the liquid crystal display panel) on a casing of the LCD is located in an airflow passage of the heat-dissipation airflow, turbulence is likely to occur in the heat-dissipation airflow flowing through the assembling structure to render the heat-dissipation airflow unable to perform uniform heat dissipation on the liquid crystal display panel. As a result, a portion of the display face of the liquid crystal display panel becomes too hot to display a screen normally. Therefore, how to provide a uniform heat-dissipation airflow for performing heat dissipation on a display panel remains an outstanding issue.

U.S. Pat. No. 7,640,662 discloses a heat exchanger that includes a gas flow cavity, the gas flow cavity having vanes therein to enable gas to flow along a sinuous path. Taiwanese Patent No. M365483 discloses a liquid crystal display apparatus, wherein an airflow guiding component guides an airflow by a guiding surface so that the airflow is free from obstruction of a timing control unit. Taiwanese Patent No. I292694 discloses a flat panel display device having a fan, wherein a back lid main body, a flow-guiding convex plate and a flow-guiding side plate cooperatively define a heat-dissipation space, and the heat-dissipation space guides an airflow to flow through a circuit board.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a display device that includes a fan, and a heat-dissipation airflow provided by the fan performs uniform heat dissipation on a display panel.

Other objectives and advantages of the invention are further illustrated by the technical features broadly embodied and disclosed as follow.

In order to achieve one or a portion of or all of the objects or other objects, an embodiment of the invention provides a display device including a casing, a display panel, a transparent plate, at least one fixing pillar, at least one flow-guiding component, and a fan. The casing has a front surface, a back surface and a side surface. The front surface is opposed to the back surface. The side surface is connected between the front surface and the back surface. The back surface has a first airflow passage. The display panel is disposed in the casing. The transparent plate is disposed on the front surface and covers the display panel. A second airflow passage is formed between the display panel and the transparent plate. The fixing pillar is disposed between the first airflow passage and the second airflow passage and configured to fix the display panel in the casing. The flow-guiding component is disposed in the second airflow passage and adjacent to the side surface. The fan is disposed on the back surface and capable of providing a heat-dissipation airflow. The heat-dissipation airflow is capable of flowing through the first airflow passage and the fixing pillar in sequence and then arrives at the flow-guiding component, and flows in the second airflow passage after being guided by the flow-guiding component.

In an embodiment, the flow-guiding component is disposed on the display panel.

In an embodiment, the casing includes a back cover and a front frame. The display panel is disposed inside the back cover. The front frame covers a portion of the display panel. The flow-guiding component is disposed between the front frame and the display panel.

In an embodiment, a material of the flow-guiding component includes foam.

In an embodiment, an extension direction of the flow-guiding component is perpendicular to the side surface.

In an embodiment, an extension direction of the flow-guiding component is inclined to the side surface.

In an embodiment, a number of the at least one flow-guiding component is plural. The fixing pillar is located between two flow-guiding components.

In an embodiment, the first airflow passage and the second airflow passage form a bending path on the side surface. The fixing pillar is located at the bending path and fixes the display panel to the side surface. The heat-dissipation airflow flows from the first airflow passage to the second airflow passage along the bending path.

In an embodiment, a plate is provided in the casing. The plate has a flow-guiding inclined plane, and the flow-guiding inclined plane extends from the fan to the side surface.

In an embodiment, the first airflow passage is formed by the flow-guiding inclined plane, the side surface and the back surface.

In an embodiment, an outflow direction of the fan is inclined to the back surface.

The embodiments of the invention have at least one of the following advantages. In the embodiments of the invention, the display device has the flow-guiding component, and the flow-guiding component is disposed in the second airflow passage and adjacent to the side surface of the casing. Accordingly, the heat-dissipation airflow flows more uniformly in the second airflow passage by guidance of the flow-guiding component after the heat-dissipation airflow flows through the first airflow passage and the fixing pillar and arrives at the second airflow passage. A situation that turbulence occurs in the heat-dissipation airflow flowing through the fixing pillar to prevent the heat-dissipation airflow from performing uniform heat dissipation on the display panel is avoided, and it is thus ensured that the display panel does not overheat and could display a screen normally.

Other objectives, features and advantages of the present invention will be further understood from the further technological features disclosed by the embodiments of the present invention wherein there are shown and described preferred embodiments of this invention, simply by way of illustration of modes best suited to carry out the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
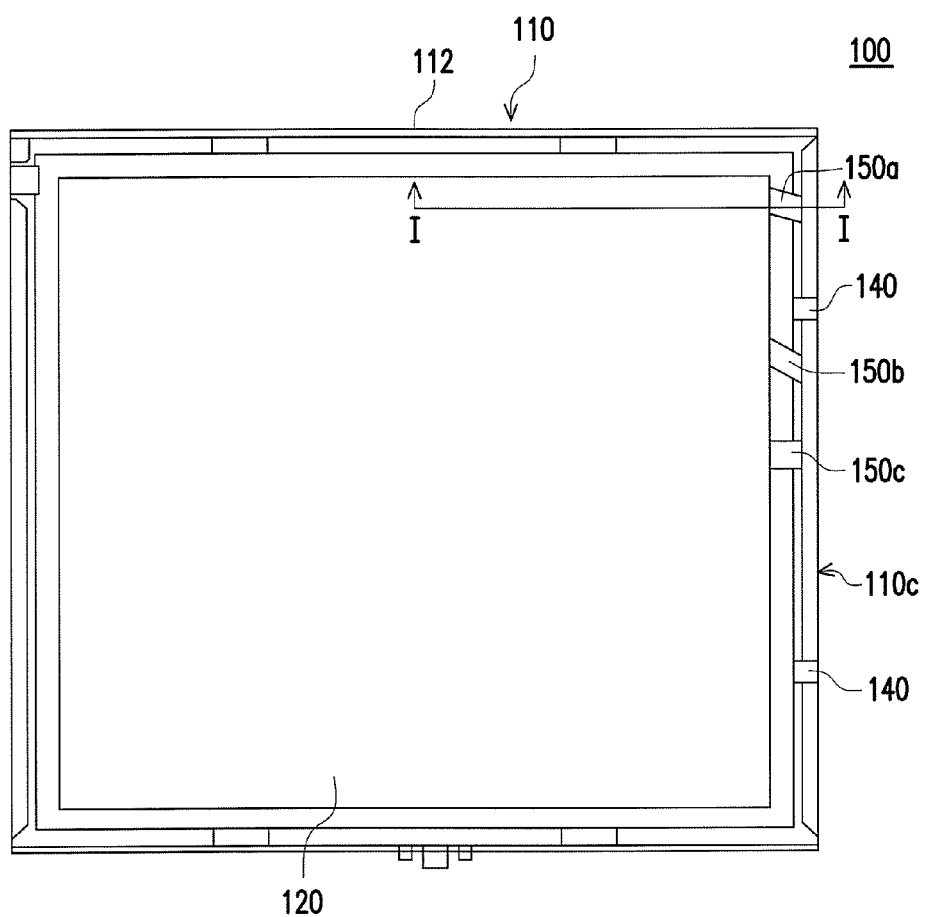
FIG. 1 is a schematic front view of a display device according to an embodiment of the invention.
Figure 2:
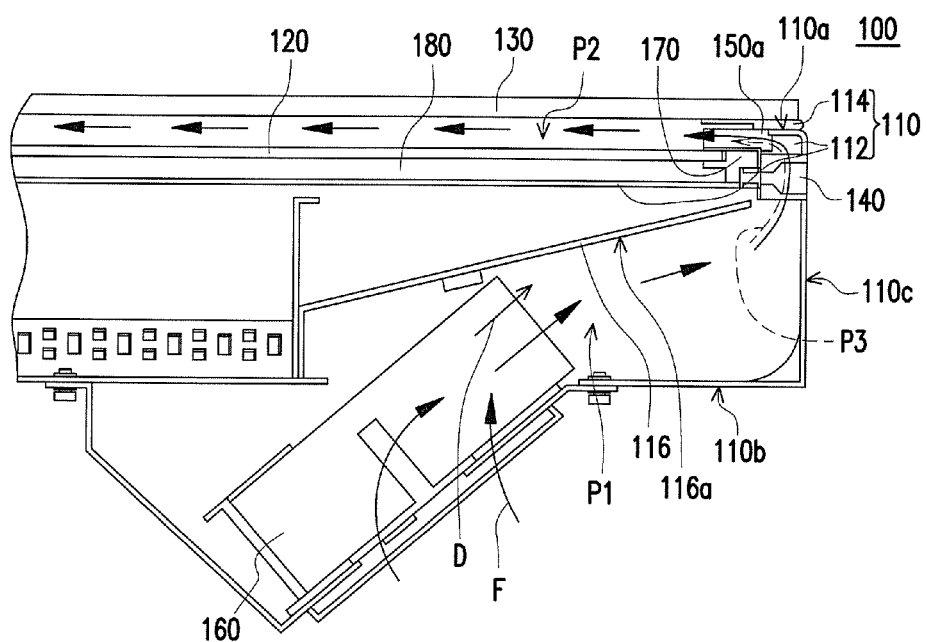
FIG. 2 is a schematic partial sectional view of the display device in FIG. 1 taken along line I-I.

FIG. 1 is a schematic front view of a display device according to an embodiment of the invention. FIG. 2 is a schematic partial sectional view of the display device in FIG. 1 taken along line I-I. For clarity of the drawing, a front frame 114, a transparent plate 130 and a fan 160 in FIG. 2 are not illustrated in FIG. 1, and flow-guiding components 150b and 150c in FIG. 1 are not illustrated in FIG. 2. Referring to FIG. 1 and FIG. 2, a display device 100 of the embodiment includes a casing 110, a display panel 120, a transparent 130, at least one fixing pillar 140 (two are exemplarily illustrated in FIG. 1), at least one flow-guiding component (three are exemplarily illustrated in FIG. 1, including a flow-guiding component 150a, a flow-guiding component 150b and a flow-guiding component 150c), and a fan 160.

The casing 110 has a front surface 110a, a back surface 110b and a side surface 110c. The front surface 110a is opposed to the back surface 110b. The side surface 110c is connected between the front surface 110a and the back surface 110b. The back surface 110b has a first airflow passage P1 (i.e., the first airflow passage P1 is located in the casing 110 and adjacent to the back surface 110b). The display panel 120 is, for example, a liquid crystal display panel, and is disposed in the casing 110. The transparent plate 130 is disposed on the front surface 110a of the casing 110 and covers the display panel 120. A second airflow passage P2 is formed between the display panel 120 and the transparent plate 130. The first airflow passage P1 and the second airflow passage P2 form a bending path P3 on the side surface 110c of the casing 110 (i.e., the bending path P3 is located in the casing 110 and adjacent to the side surface 110c).

The fixing pillar 140 is disposed between the first airflow passage P1 and the second airflow passage P2 and located at the bending path P3. The fixing pillar 140 is configured to fix the display panel 120 in the casing 110, wherein a fixing component (not shown), for example, is used to pass from the side surface 110c of the casing 110 through the fixing pillar 140 and is fixed to the display panel 120, so that the display panel 120 is fixed to the side surface 110c of the casing 110. In detail, the display panel 120 is disposed on a supporting frame 170, the supporting frame 170 has a blind hole (not shown) correspond to the fixing pillar 140 and the fixing component, wherein the fixing component passes from the side surface 110c of the casing 110 through a taper hole of the fixing pillar 140 and is fixed to the blind hole of the supporting frame 170, so that the display panel 120 is fixed in the casing 110. The fan 160 is disposed on the back surface 110b of the casing 110 and capable of providing a heat-dissipation airflow F (illustrated in FIG. 2). The heat-dissipation airflow F flows from outside, and then flows from the first airflow passage P1 to the second airflow passage P2 along the bending path P3, so as to perform heat dissipation on the display panel 120. The flow-guiding components 150a, 150b and 150c are disposed in the second airflow passage P2 and adjacent to the side surface 110c of the casing 110, so that the heat-dissipation airflow F flows through the first airflow passage P1 and the fixing pillar 140 in sequence and then arrives at the flow-guiding components 150a, 150b and 150c, and flows in the second airflow passage P2 after being guided by the flow-guiding components 150a, 150b and 150c.

The display device 100 of the embodiment is used in, for example, an outdoor equipment such as an automatic teller machine (ATM) by acting as a display interface or touch operation interface of the outdoor equipment. Through the above configuration, after the heat-dissipation airflow F flows through the first airflow passage P1 and the fixing pillar 140 and arrives at the second airflow passage P2, by guidance of the flow-guiding components 150a, 150b and 150c, the heat-dissipation airflow F flows more uniformly in the second airflow passage P2. A situation that turbulence occurs in the heat-dissipation airflow F flowing through the fixing pillar 140 to prevent the heat-dissipation airflow F from performing uniform heat dissipation on the display panel 120 is avoided, and it is thus ensured that the display panel 120 displays a screen normally without overheating due to sunlight irradiation. In other embodiments, the display device 100 may also be used in other kinds of equipment, and the invention is not thereby limited.

Referring to FIG. 2, in detail, the casing 110 of the embodiment includes a back cover 112 and a front frame 114. The display panel 120 is disposed inside the back cover 112, and the front frame 114 extends along a periphery of the display panel 120 to cover a portion of the display panel 120. Moreover, a backlight module 180 is disposed on the back cover 112 and located between the display panel 120 and the back cover 112, wherein the backlight module 180 provides a light beam to display panel 120 for displaying image. The flow-guiding components 150a, 150b and 150c are disposed on the display panel 120 and located between the front frame 114 and the display panel 120. In detail, the flow-guiding components 150a, 150b and 150c are disposed on the supporting frame 170 and located between the front frame 114 and the supporting frame 170. In the embodiment, a material of the flow-guiding components 150a, 150b and 150c includes, for example, foam, so that the flow-guiding components 150a, 150b and 150c are stably sandwiched between the front frame 114 and the display panel 120 by compressibility of the foam. In other embodiments, the material of the flow-guiding components 150a, 150b and 150c may be other suitable material, and the invention is not thereby limited.

Figure 3:
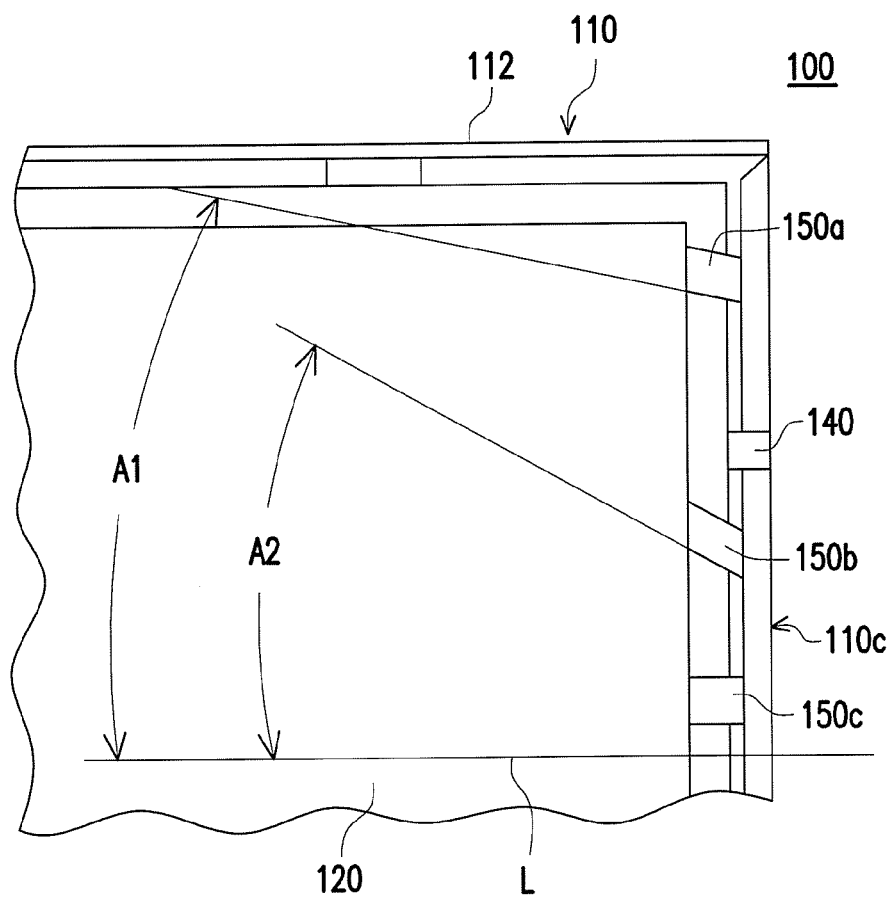
FIG. 3 is a schematic partially enlarged view of the display device in FIG. 1.

Referring to FIG. 1, in the embodiment, one fixing pillar 140 is located between the flow-guiding component 150a and the flow-guiding component 150b. Extension directions of the flow-guiding component 150a and the flow-guiding component 150b are inclined to the side surface 110c of the casing 110, and an extension direction of the flow-guiding component 150c is perpendicular to the side surface 110c of the casing 110. FIG. 3 is a schematic partially enlarged view of the display device in FIG. 1. To simplify the description, a reference line L perpendicular to the side surface 110c is defined in FIG. 3. Referring to FIG. 3, in the embodiment, an angle A1 between the extension direction of the flow-guiding component 150a and the reference line L is, for example, 10 degrees, an angle A2 between the extension direction of the flow-guiding component 150b and the reference line L is, for example, 25 degrees, and the extension direction of the flow-guiding component 150c is parallel to the reference line L. In other embodiments, according to needs associated with flow guidance or other design needs, the fixing pillar and the flow-guiding components may be disposed in other suitable relative positions, the flow-guiding components may be disposed inclined or perpendicular to the side surface of the casing, and other suitable numbers of flow-guiding components may be provided. The invention is not thereby limited.

Referring to FIG. 2, an outflow direction D of the fan 160 of the embodiment is inclined to the back surface 110b of the casing 110. A plate 116 is in the casing 110. The plate 116 has a flow-guiding inclined plane 116a. The flow-guiding inclined plane 116a extends from the fan 160 to the side surface 110c of the casing 110, so that the first airflow passage P1 is formed by the flow-guiding inclined plane 116a of the plate 116, the side surface 110c of the casing 110 and the back surface 110b of the casing 110. In other embodiments, the fan 160 may have other outflow directions, and the first airflow passage P1 may be formed by other suitable structure, and the invention is not thereby limited.

In summary, the embodiments of the invention have at least one of the following advantages. In the above embodiments of the invention, the display device has the flow-guiding component, and the flow-guiding component is disposed in the second airflow passage and adjacent to the side surface of the casing. Accordingly, the heat-dissipation airflow flows more uniformly in the second airflow passage by guidance of the flow-guiding component after the heat-dissipation airflow flows through the first airflow passage and the fixing pillar and arrives at the second airflow passage. A situation that turbulence occurs in the heat-dissipation airflow flowing through the fixing pillar to prevent the heat-dissipation airflow from performing uniform heat dissipation on the display panel is avoided, and it is thus ensured that the display panel does not overheat and could display a screen normally.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display device, comprising:
   a casing, having a front surface, a back surface and a side surface, the front surface being opposed to the back surface, the side surface being connected between the front surface and the back surface, the back surface having a first airflow passage;
   a display panel, disposed in the casing;
   a transparent plate, disposed on the front surface and covering the display panel, wherein a second airflow passage is formed between the display panel and the transparent plate;
   at least one fixing pillar, disposed between the first airflow passage and the second airflow passage and configured to fix the display panel in the casing;
   at least one flow-guiding component, disposed in the second airflow passage and adjacent to the side surface; and
   a fan, disposed on the back surface and capable of providing a heat-dissipation airflow, wherein the heat-dissipation airflow is capable of flowing through the first airflow passage and the fixing pillar in sequence and then arrives at the flow-guiding component, and flows in the second airflow passage after being guided by the flow-guiding component.

2. The display device according to claim 1, wherein the flow-guiding component is disposed on the display panel.

3. The display device according to claim 1, wherein the casing comprises a back cover and a front frame, the display panel is disposed inside the back cover, the front frame covers a portion of the display panel, and the flow-guiding component is disposed between the front frame and the display panel.

4. The display device according to claim 1, wherein a material of the flow-guiding component comprises foam.

5. The display device according to claim 1, wherein an extension direction of the flow-guiding component is perpendicular to the side surface.

6. The display device according to claim 1, wherein an extension direction of the flow-guiding component is inclined to the side surface.

7. The display device according to claim 1, wherein a number of the at least one flow-guiding component is plural, and the fixing pillar is located between two of the flow-guiding components.

8. The display device according to claim 1, wherein the first airflow passage and the second airflow passage form a bending path on the side surface, the fixing pillar is located at the bending path and fixes the display panel to the side surface, and the heat-dissipation airflow flows from the first airflow passage to the second airflow passage along the bending path.

9. The display device according to claim 1, wherein a plate is provided in the casing, the plate has a flow-guiding inclined plane, and the flow-guiding inclined plane extends from the fan to the side surface.

10. The display device according to claim 9, wherein the first airflow passage is formed by the flow-guiding inclined plane, the side surface and the back surface.

11. The display device according to claim 1, wherein an outflow direction of the fan is inclined to the back surface.

* * * * *